(12) United States Patent
Sharma et al.

(10) Patent No.: US 10,320,345 B2
(45) Date of Patent: Jun. 11, 2019

(54) AMPLIFIER ARCHITECTURE USING POSITIVE ENVELOPE FEEDBACK

(71) Applicant: SKYWORKS SOLUTIONS, INC., Woburn, MA (US)

(72) Inventors: Smarjeet Sharma, Montreal (CA); Nicolas Gerard Constantin, Notre-Dame-de-l'Ile-Perrot (CA)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/862,914

(22) Filed: Jan. 5, 2018

(65) Prior Publication Data

US 2018/0198424 A1 Jul. 12, 2018

Related U.S. Application Data

(60) Provisional application No. 62/443,623, filed on Jan. 6, 2017, provisional application No. 62/446,372, filed on Jan. 14, 2017.

(51) Int. Cl.
*H04B 1/04* (2006.01)
*H03F 3/195* (2006.01)
*H03F 1/02* (2006.01)
*H03F 3/24* (2006.01)
*H03F 1/56* (2006.01)
(Continued)

(52) U.S. Cl.
CPC .......... *H03F 3/195* (2013.01); *H03F 1/0222* (2013.01); *H03F 1/0272* (2013.01); *H03F 1/0288* (2013.01); *H03F 1/0294* (2013.01); *H03F 1/565* (2013.01); *H03F 3/245* (2013.01); *H03F 3/45188* (2013.01); *H03F 3/72* (2013.01); *H03F 2200/102* (2013.01); *H03F 2200/111* (2013.01); *H03F 2200/451* (2013.01); *H03F 2203/45481* (2013.01); *H03F 2203/7209* (2013.01)

(58) Field of Classification Search
CPC .......... H04B 1/04; H04B 1/0475; H04B 1/40; H04B 17/13; H04B 2001/0416; H04B 2001/0433; H04B 2001/045; H04W 52/52; H04L 27/04; H03F 1/3247; H03F 3/195; H03F 3/211; H03F 3/213; H03F 2200/105; H03F 2200/387; H03F 2203/45112
USPC ............ 455/114.2, 114.3, 115.1, 126, 127.1, 455/127.2, 127.3; 375/296, 297; 330/124 R, 127, 261, 285, 295, 296
See application file for complete search history.

(56) References Cited

U.S. PATENT DOCUMENTS 6,137,354 A * 10/2000 Dacus .................. H03F 1/0255
330/297
7,091,777 B2 * 8/2006 Lynch .................. H03F 1/0222
330/127
(Continued)

*Primary Examiner* — Quochien B Vuong
(74) *Attorney, Agent, or Firm* — Chang & Hale LLP

(57) ABSTRACT

Described herein are power amplifier (PA) architectures that improve PA performance (e.g., efficiency, linearity, etc.) over an extended range of the operating power levels of the PA. These architectures can be implemented on a single chip to provide a single-chip standalone PA solution. This improvement comes with little additional complexity, little additional current consumption, and/or little additional chip area. The architectures utilize a dynamic biasing technique using positive envelope feedback based at least in part on an instantaneous envelope signal at an output of a power amplifier.

20 Claims, 11 Drawing Sheets

(51) Int. Cl.
*H03F 3/45* (2006.01)
*H03F 3/72* (2006.01)

(56) References Cited

U.S. PATENT DOCUMENTS

| | | | |
|---|---|---|---|
| 7,372,333 B2 * | 5/2008 | Abedinpour | H03F 1/0227 330/207 A |
| 7,405,617 B2 * | 7/2008 | Constantin | H03F 1/301 330/296 |
| 7,421,254 B2 * | 9/2008 | Behzad | H03F 1/0261 455/127.1 |
| 9,413,303 B2 * | 8/2016 | Mostov | H03F 1/0227 |

* cited by examiner

AMPLIFIER ARCHITECTURE USING POSITIVE ENVELOPE FEEDBACK

CROSS-REFERENCE TO RELATED APPLICATIONS

This application claims priority to U.S. Provisional Application Nos. 62/443,623 filed Jan. 6, 2017 and entitled "Amplifier Architecture Using Positive Envelope Feedback," and 62/446,372 filed Jan. 14, 2017 and entitled "Amplifier Architecture Using Positive Envelope Feedback," each of which is expressly incorporated by reference herein in its entirety for all purposes.

BACKGROUND

Field

The present disclosure generally relates to power amplification systems configured to amplify signals for wireless communication.

Description of Related Art

Power amplification systems can be used to amplify wireless signals for transmission. These amplification systems can be powered using a supply voltage. The supply voltage can be varied based on an envelope of the signal to be amplified to improve power amplifier efficiency, otherwise known as envelope tracking.

SUMMARY

According to a number of implementations, the present disclosure relates to a power amplifier architecture that includes a multi-stage amplifier having an input port and an output port, the multi-stage amplifier to receive an input signal at the input port and to provide an amplified output signal at the output port. The power amplifier architecture also includes an envelope detector coupled to the output port of the multi-stage amplifier, the envelope detector configured to receive a signal corresponding to the amplified output signal and to generate an envelope signal related to an envelope of the amplified output signal. The power amplifier architecture also includes a dynamic bias signal generator coupled to the envelope detector and to the multi-stage amplifier, the dynamic bias signal generator configured to receive the envelope signal from the envelope detector, to generate a dynamic bias signal related to the envelope of the amplified output signal, and to provide the dynamic bias signal to the multi-stage amplifier.

In some embodiments, the power amplifier architecture is implemented on a single chip. In some embodiments, dynamic bias signal generator includes a voltage divider configured to scale the envelope signal received from the envelope detector. In further embodiments, the dynamic bias signal generator receives a DC signal that is used to offset the scaled envelope signal to generate the dynamic bias signal. In further embodiments, the DC signal corresponds to a quiescent biasing condition of the multi-stage amplifier.

In some embodiments, the multi-stage amplifier includes a driver stage coupled to the input port and a power stage coupled to the output port. In further embodiments, the dynamic bias signal is used to bias a transistor of the power stage.

In some embodiments, the envelope detector is configured to detect signals that span an expected range of amplitudes of the amplified output signal. In some embodiments, a loop gain is less than or equal to 0 dB, the loop gain including a gain of an up-conversion gain through the multi-stage amplifier and a gain of a signal path through the envelope detector and the dynamic bias signal generator. In further embodiments, the loop gain is less than or equal to −3 dB.

In some embodiments, a loop bandwidth is at least four times higher than a bandwidth of the envelope of the amplified output signal. In some embodiments, the envelope signal generated by the envelope detector corresponds to an instantaneous output power of the multi-stage amplifier. In some embodiments, the power amplifier architecture is implemented using CMOS or GaAs technologies. In some embodiments, the power amplifier architecture is implemented on a single chip and does not use signal processing provided by a component that is not on the single chip to determine the envelope signal or to determine the dynamic bias signal.

According to a number of implementations, the present disclosure relates to a radio-frequency (RF) module that includes a packaging substrate configured to receive a plurality of components. The RF module also includes a power amplification system implemented on the packaging substrate, the power amplification system including a multi-stage amplifier configured to provide an amplified output signal having an envelope, an envelope detector configured to detect the envelope of the amplified output signal, and a resistive voltage shifter configured to generate a dynamic bias signal related to the detected envelope of the amplified output signal and to provide the dynamic bias signal to the multi-stage amplifier.

In some embodiments, the RF module is a front-end module (FEM). In some embodiments, the multi-stage amplifier, the envelope detector, and the resistive voltage shifter are implemented on a single chip.

According to a number of implementations, the present disclosure relates to a wireless device that includes a transceiver configured to generate an input radio-frequency (RF) signal. The wireless device includes a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an amplified output RF signal, the power amplification system including a multi-stage amplifier configured to provide the amplified output signal having an envelope, an envelope detector configured to detect the envelope of the amplified output signal, and a resistive voltage shifter configured to generate a dynamic bias signal related to the detected envelope of the amplified output signal and to provide the dynamic bias signal to the multi-stage amplifier. The wireless device includes an antenna in communication with the FEM, the antenna configured to transmit the output RF signal.

In some embodiments, the resistive voltage shifter includes a voltage divider to scale the detected envelope. In some embodiments, the dynamic bias signal biases a gate of a transistor of the multi-stage amplifier.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

DETAILED DESCRIPTION OF SOME EMBODIMENTS

Figure 1:
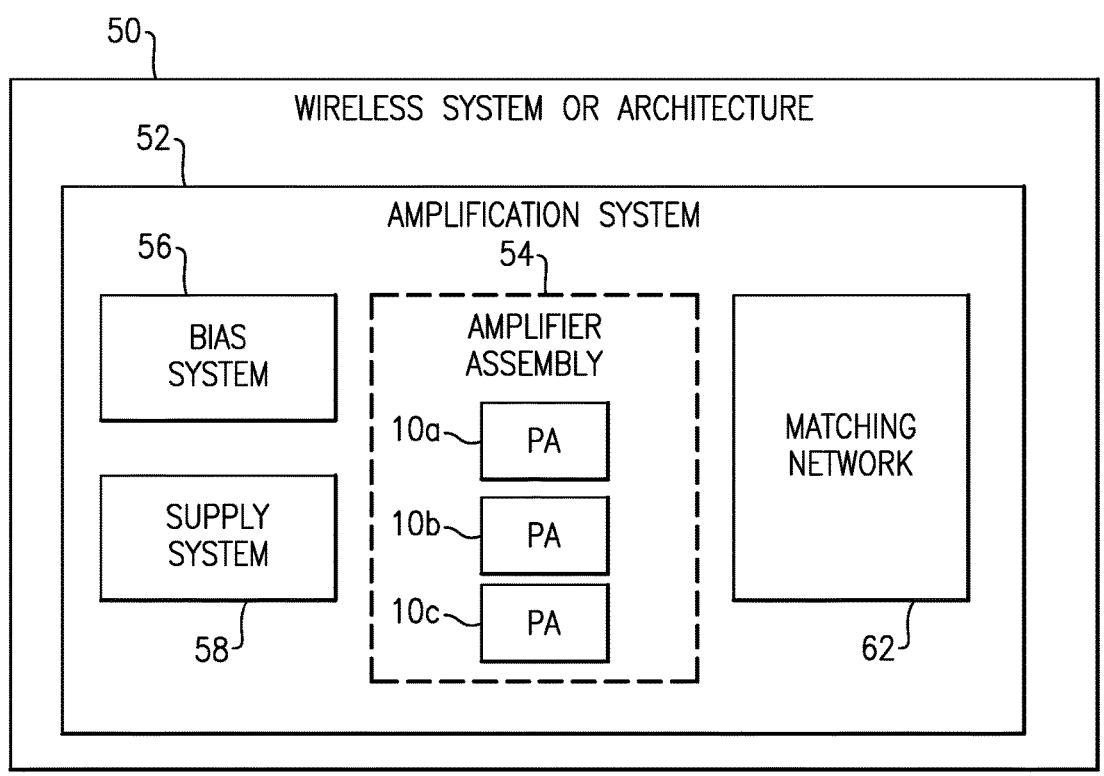
FIG. 1 illustrates a wireless communications configuration having an amplification system with a bias system that provides a bias signal that is modified based at least in part on an output signal of a power amplifier.

The headings provided herein, if any, are for convenience only and do not necessarily affect the scope or meaning of the claimed invention.

Described herein are power amplifier (PA) architectures that improve PA performance (e.g., efficiency, linearity, etc.) over an extended range and/or the entire range of the operating power levels of the PA. These architectures can be implemented on a single chip to provide a single-chip standalone PA solution. This improvement comes with little additional complexity, little additional current consumption, and/or little additional chip area.

The architectures utilize a dynamic biasing technique using positive envelope feedback based at least in part on an instantaneous envelope signal at an output of a power amplifier. In certain implementations, the disclosed architectures and methods extend the output 1 dB compression point (P1 dB) of a power amplifier by about 1.7 dB while maintaining stability and noise within targeted ranges for a power amplifier with P1 dB of 19.5 dBm. Consequently, targeted linearity performance can be achieved at a higher power level relative to static or constant biasing techniques. This linearity performance can be achieved with little or no increase in the size of the device, with little or no increase in current consumption, and/or little or no additional quiescent current. The disclosed architectures and methods can be suitable for wide bandwidths.

Overview

With the use of increasingly complex modulated communication signals, the design specifications of the PA have become more stringent. A consequence of using such modulation schemes is that even though the PA may be transmitting at a particular average power level, the actual power level transmitted by the PA at any given time may be several decibels (dBs) higher than the average power level. This power level, referred to herein as the instantaneous power level, varies at a frequency determined by the envelope frequency used for the modulated signal.

In many modulation schemes, the peak-to-average power ratio (PAPR) of the instantaneous output power of the PA may be relatively high compared to other modulation schemes. As a result, it is desirable to improve performance of the PA over a targeted range or the entire range of power levels associated with the average and instantaneous power levels of the employed modulation scheme. It is further desirable to achieve efficiency and/or linearity improvement of the PA with techniques that allow single-chip implementation. It is also desirable to achieve performance gains with little or no additional power consumption.

Accordingly, described herein are PA architectures that use a positive envelope feedback scheme to implement dynamic biasing based on a signal flow from the PA output to its bias input. This dynamic biasing is a function of the instantaneous envelope power at the output of the PA.

The disclosed PA architectures use an envelope detector at the output of the PA to detect the instantaneous output power level of the PA. The output of the envelope detector is applied to a resistive voltage shifter circuit. The implementation of the voltage shifter circuit can be achieved using resistors for a voltage divider and a DC signal. The voltage shifter circuit is configured to bring the detector output to a targeted level in terms of voltage swing values, before being injected back into the PA system as the dynamic bias signal. The dynamic bias signal can be proportional to the signal at the output of the envelope detector with a DC offset. This dynamic bias signal is then applied to the gate of the power stage transistors of the PA.

The disclosed PA architectures are relatively simple and can be implemented using little additional circuit overhead (e.g., low quiescent current consumption and/or low silicon area). In some embodiments, the disclosed architectures can be fully implemented on-chip using CMOS or GaAs technologies. In various embodiments, the disclosed PA architectures can be implemented as a standalone PA without the need for additional external signal processing. In certain embodiments, the disclosed PA architectures improve the power added efficiency (PAE) of the PA with little or no negative effect on PA linearity. In various implementations, the disclosed PA architectures are configured to efficiently and effectively operate over a relatively large range of envelope bandwidths. This enables the disclosed architectures to be implemented where envelope bandwidths are expected to be relatively high. Furthermore, the simplicity of the disclosed PA architectures facilitates incorporation of the architectures into existing RFIC PA configurations.

The disclosed PA architectures provide a number of advantages relative to other techniques aimed at improving PA performance. Examples of such techniques include Envelope Tracking (ET) PAs, Doherty PAs, tunable matching networks, digitally-controlled PAs, and discrete "ON/OFF" switching of transistor matrices. The disclosed PA architectures provide one or more advantages over PAs that employ any one or a combination of such improvement techniques. For example, though these other techniques address the desire for improved PA performance, they do not necessarily provide improved performance while also providing circuit simplicity, targeted current consumption, and/or occupation of space for single-chip integration. Additionally, the disclosed PA architectures provide improved PA performance based on the true output envelope signal of the PA rather than on other signals.

For example, ET PAs use supply modulators for adjusting the voltage supply level to the transistor drain/collector as a function of the input signal envelope. Such schemes enable efficient operation over a large range of signal levels. However, supply modulators used for certain ET systems operate at relatively high values of DC voltage and current levels, and any decrease in the efficiency of the supply modulators can adversely affect the power added efficiency (PAE) of the entire PA system.

As another example, switching "ON/OFF" transistor matrices use shunt switches that are triggered by discretized threshold levels of the output power of the PA. Tunable matching networks can also use switching schemes at discretized threshold levels of the output power of the PA to implement load configurations tailored or optimized above or below the discretized power levels of interest. However, discrete switching (ON/OFF) systems and tunable matching networks are commonly associated with large step variations of output power. Even though such a variation may be tolerated at sufficiently backed-off output power levels, discrete switching systems additionally use multiple comparators for detecting predetermined threshold power levels, which adds increased complexity to its implementation.

Other techniques include digital pre-distortion techniques and digitally-controlled PAs, where PA performance is improved with the help of digital signal processing (DSP) algorithms. However, digital processing techniques may present a circuit overhead in terms of the DSP processors (along with their associated power consumption) necessary to implement them.

As another example, some schemes employ biasing of the transistor gate as a function of the power levels of the PA. Implementations of such biasing include PA architectures where the biasing signal relies on an externally varied control signal, where the biasing signal is triggered at discrete input power levels using switches, and where the biasing signal is a function of average power levels. However, power-dependent gate biasing techniques that have been demonstrated also commonly suffer from the requirements of additional external circuits and/or signal processing capabilities. Gate biasing techniques that are a function of the average power levels of the PA typically do not significantly improve PA performance under complex modulation schemes. As described herein, this may be due at least in part to the instantaneous power level of the PA being significantly different from the average power level of the PA.

As another example, a PA architecture can use two cascaded sections of a bias circuit to dynamically adjust the bias level of the PA. Such architectures use a switching mechanism based on a bias current threshold value and depends on sensing the bias current through the first section of the bias circuit. This bias current gives a rough approximation of the envelope of the modulated RF signal. When the bias current of the first section of the bias circuit is greater than a predetermined threshold value, the second section of the biasing circuit is used to modify the biasing level for the PA architecture. However, this approach relies on a switching mechanism that is based on a predetermined bias current threshold value. Because sensing the bias current of the first section only gives a rough approximation of the envelope of the modulated RF signal, the generated driving signal at the input of the PA is not necessarily dependent on the true output envelope power of the PA. The absence of an actual signal flow from the PA output to the dynamic bias signal input entails added uncertainties, for example uncertainties arising from load mismatch effects at the output of the PA. The architecture also utilizes a signal path through the bias circuitry, and therefore is limited by the biasing circuits. Such limitations, such as those related to noise and bandwidth of the biasing circuits, can impair performance of the PA. They may also complicate implementation of the architecture, especially in the context of fast-varying envelope modulation schemes.

Other examples include dynamic biasing approaches based on envelope power levels with the help of digital signal processing applied to the envelope signal. Dynamic biasing may also be accomplished using external signal processing elements for voltage shaping. An improvement in linear output power of the PA can be achieved using an envelope detector at the driver stage output to modulate the power stage bias. PA efficiency improvement for a Doherty structure may also be achieved using an envelope detector at the input of the PA to provide a dynamic bias to the sub-PA. However, dynamic biasing using envelope detection at the PA input and using envelope detection at the PA driver stage output suffer from uncertainties arising from the absence of an actual signal flow from the output of the PA to the dynamic bias signal. Additionally, biasing of power stage transistors based on input envelope detection should compensate for delay through the PA chain and associated circuitry, since such phase delay affects the linearity of the PA. Such phase compensation networks present additional area requirements for on-chip integration. Input envelope power detection also places requirements on the detector design itself. Detecting input envelope power may be difficult due at least in part to the small absolute values of power levels associated with the input envelope signal of the PA. This may require relatively high power resolution for the envelope detector. Disadvantageously, these dynamic biasing approaches may add complex circuitry and require increased power consumption for their implementation. Furthermore, such dynamic biasing approaches may not be exclusively a function of the true instantaneous output envelope power of the PA, which depends at least in part on output load mismatch conditions. This makes their incorporation into existing single-chip RFIC PA configurations prohibitively complex in some cases, and/or introduces limitations due to not detecting the true instantaneous envelope power at the output of the PA.

Accordingly, the proposed PA architecture utilizes dynamic biasing based at least in part on positive envelope feedback of the instantaneous output power of the PA to improve performance. The dynamic biasing signal is directly applied to the gate of the transistors in the power stage of the PA. The disclosed PA architectures provide a significant improvement of the power added efficiency (PAE) of the PA without significantly compromising linearity of the PA.

The disclosed PA architectures offer a number of advantages over other PA design approaches described herein. For example, due at least in part to the detection of the true instantaneous envelope power at the PA output, the described dynamic biasing does not suffer from uncertainties that are associated with techniques that use an indirect estimation of the output envelope power of the PA. For example, the disclosed PA architectures do not suffer from the uncertainties present in schemes that use a rough approximation of the envelope of the modulated RF signal of the PA based on sensing the bias current through a section of two cascaded sections of the bias circuit. Similarly, the disclosed PA architectures do not suffer from the uncertainties present in schemes that use dynamic biasing based on envelope detection at the input of the PA. Such dynamic biasing approaches fail to account for possible uncertainties related to the output envelope conditions of the PA, such as those due to output load mismatch conditions. Accordingly, disclosed herein are dynamic biasing architectures that account for such uncertainties by using a method that is based on the value of the true instantaneous envelope power at the PA output.

Advantageously, the disclosed PA architectures use a signal path from the output of the PA to the dynamic bias signal that does not rely on signal flow through the biasing circuits of the PA. It therefore does not suffer from bandwidth limitations of the biasing circuits of the PA as in other PA architectures. This is advantageous because bias circuits are typically limited in bandwidth due to noise considerations. To achieve a PA architecture that can be used over a large range of envelope bandwidths, it is beneficial to utilize a dynamic biasing signal that is not bandwidth limited in a range of interest.

Advantageously, the dynamic biasing signal in the disclosed PA architectures is a function of the true instantaneous output power of the PA, which differs from biasing schemes that are based on average output power. This allows the performance of the PA to be significantly improved for envelope-varying modulated signal schemes. Furthermore, the dynamic biasing signal disclosed herein is a continuously varying function of the instantaneous output power of the PA. This is in contrast to PA architectures that use discrete bias switching schemes based on comparison with threshold power levels. Such discrete switching configurations suffer from issues regarding linearity and the complexity of their implementation. These issues are at least partially overcome in the disclosed implementations of the PA architectures.

Other advantages of the disclosed PA architectures include that the additional current and area to implement the disclosed PA architectures is relatively small, and the disclosed architectures do not require any additional external signal processing elements. This facilitates its implementation as a standalone PA solution, unlike PA techniques that can be significantly power hungry (such as some ET PAs), or PAs that utilize significant external circuitry that cannot be easily implemented as a single-chip solution (such as PA architectures that use DSP algorithms or those that use extensive signal processing). In some embodiments, the disclosed PA architectures do not use signal processing provided by an off-chip digital signal processor or similar component or components.

The disclosed PA architectures advantageously detect the output envelope of the PA instead of the input envelope. This allows certain design constraints of the envelope detector to be relaxed. Since the absolute value of the envelope swing at the output of the PA is significantly larger than at the PA input, the power resolution for the envelope detector can be relaxed when detecting the envelope at the output of the PA compared to detecting it at the input of the PA. Using a dynamic biasing scheme for power stage transistors that is based on envelope detection of the envelope power at the output of the PA also reduces or eliminates the need for additional phase compensation networks.

Accordingly, the disclosed PA architectures are relatively simple, consume little additional current, and require little additional chip area. This facilitates on-chip integration of the disclosed PA architectures into existing RFIC PA configurations. This also offers an advantageous solution for standalone PAs intended for large bandwidth applications without utilizing additional off-chip signal processing.

Referring to FIG. 1, one or more features of the present disclosure generally relate to a wireless communications configuration 50 having an amplification system 52. In some embodiments, the amplification system 52 can be implemented as one or more devices, and such device(s) can be utilized in the wireless communications configuration 50. In some embodiments, the wireless communications configuration 50 can be implemented in, for example, a portable wireless device. Examples of such a wireless device are described herein.

The amplification system 52 typically includes a radio-frequency (RF) amplifier assembly 54 having one or more power amplifiers (PAs) 10a-10c. In the example of FIG. 1, three PAs 10a-10c are depicted as forming the RF amplifier assembly 54. It will be understood that other numbers of PA(s) can also be implemented.

In some embodiments, the RF amplifier assembly 54 can be implemented on one or more semiconductor die, and such die can be included in a packaged module such as a power amplifier module (PAM) or a front-end module (FEM). Such a packaged module is typically mounted on a circuit board associated with, for example, a portable wireless device. In some embodiments, each PA 10a-10c can be implemented on a single die or chip, packaged as a single-chip, standalone PA.

The PAs (e.g., 10a-10c) in the amplification system 52 can be biased through a bias system 56. As described herein, one or more stages of the PAs 10a-10c can receive a bias signal that is modified based at least in part on an output signal of the particular PA. Further, supply voltages for the PAs can be provided by a supply system 58. In some embodiments, either or both of the bias system 56 and the supply system 58 can be included in the foregoing packaged module having the RF amplifier assembly 54.

In some embodiments, the amplification system 52 can include a matching network 62. Such a matching network can be configured to provide input matching and/or output matching functionalities for the RF amplifier assembly 54.

Example Power Amplifier Architectures with Positive Envelope Feedback

Figure 2A:
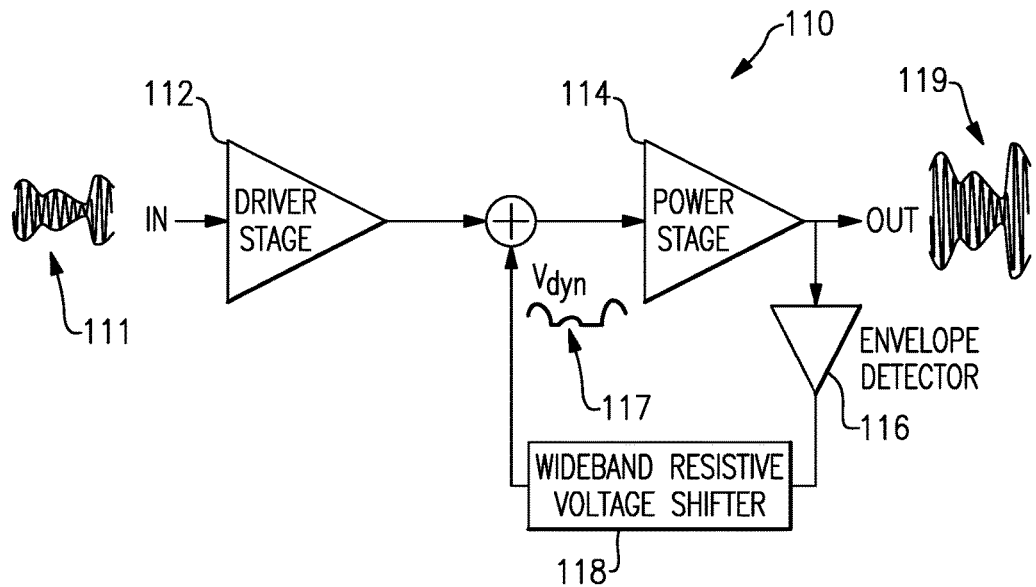
FIG. 2A illustrates a radio-frequency integrated circuit (RFIC) power amplifier architecture using positive envelope feedback to improve performance of the PA.

FIG. 2A illustrates a radio-frequency integrated circuit (RFIC) power amplifier architecture 110 using positive envelope feedback to improve performance of the PA. Performance can be improved, for example, by way of improved efficiency and/or improved linearity relative to other PA designs. The RFIC PA 110 includes a driver stage 112 and a power stage 114 that are collectively configured to receive an input signal 111 and to generate an amplified output signal 119. Each amplifier stage 112, 114 can be implemented as one or more transistors.

The RFIC PA 110 includes an envelope detector 116 and a voltage shifter 118 that together generate a dynamic bias signal (Vdyn) 117. The dynamic bias signal 117 is provided to the power stage 114 to improve PA performance. The dynamic bias signal 117 generated by the envelope detector 116 and the voltage shifter 118 is related to the instantaneous power at the output of the PA 110. In some embodiments, the dynamic bias signal 117 is proportional to the envelope detected by the envelope detector 116. It is to be understood, however, that the dynamic bias signal 117 can be generated using the envelope of the output of the PA 110 through any suitable mathematical function. In some embodiments, the dynamic bias signal 117 is greater than or equal to a threshold bias value. For example, where the envelope detected by the envelope detector 116 is less than a threshold envelope value, the voltage shifter 118 is configured to generate a dynamic bias signal 117 that has the threshold bias value and where the detected envelope is greater than the threshold envelope value, the voltage shifter 118 generates a dynamic bias signal that is proportional (or otherwise mathematically related) to the detected envelope.

The RFIC PA architecture 110 employs dynamic biasing through positive envelope feedback of the instantaneous output power of the PA. The dynamic bias signal (Vdyn) is applied to the gate of the power stage transistors 114 of the two-stage PA. The dynamic bias signal 117 can be varied dynamically and continuously as a function of the instantaneous output power level of the PA. For low instantaneous output power levels, the dynamic bias signal 117 can be held at a constant DC value which corresponds to the quiescent biasing conditions of the PA. For high instantaneous output power levels, an increase in the instantaneous output power level of the PA can result in a corresponding increase of the dynamic bias signal 117 (e.g., a positive feedback scheme). The output of the envelope detector 116 can be applied to the resistive voltage shifter circuit 118. The voltage shifter circuit 118 can be implemented using resistors for a voltage divider, and a constant DC signal, as described in greater detail herein with respect to FIG. 4. The voltage shifter circuit 118 therefore has a wideband frequency response. Together, the envelope detector 116 and the voltage shifter circuit 118 have a wideband frequency response. The voltage shifter 118 is configured to bring the output of the envelope detector 116 to the targeted level, in terms of voltage swing values, before being injected back into the PA system as the dynamic bias signal 117. The dynamic bias signal 117 can be therefore proportional to the signal at the output of the envelope detector 116 with a DC offset that defines the quiescent biasing conditions of the PA.

The envelope detector 116 can be configured so that its dynamic range of detection corresponds to expected PA output power levels. This can be particularly beneficial where linearity of the PA is important. The dynamic bias signal 117 can be held at a low quiescent value and can be allowed to increase as a continuous function of the instantaneous output power of the PA at higher output power levels. Advantageously, the PA architecture 110 provides a significant improvement in the power added efficiency (PAE) of the PA without significantly compromising linearity of the PA at higher output power levels. Thus, the PA architecture 110 can be configured to be more efficient while providing comparable linearity over a wide dynamic range relative to other PA architectures that do not include dynamic bias signals as described herein.

An advantage of the PA architecture 110 is that it does not significantly increase current consumption relative to a PA architecture that includes constant DC bias signals. For example, the envelope detector 116 at the output of the PA consumes additional current. However, the current consumption of the envelope detector 116 can be designed such that it is negligible compared to the total current consumption of the entire PA system. Furthermore, the envelope detector 116 can be configured to have high input impedance so that it negligibly affects the performance of the RFIC PA architecture 110.

An advantage of the PA architecture 110 is that a single-chip implementation of the PA architecture 110 utilizes a comparable amount of area relative to a PA architecture with a constant DC bias signal. Furthermore, the PA architecture 110 remains relatively simple (e.g., it does not significantly increase complexity) relative to a PA architecture with a constant DC bias signal. Accordingly, the RFIC PA architecture 110 offers a beneficial solution for a single-chip implementation of a standalone PA. The PA architecture 110 improves PA performance, for example, without complex additional circuitry, such as may be present in other PA architectures (as described in greater detail herein).

The PA 110 provides a number of advantages over other similar multi-staged power amplifier architectures that utilize a constant DC gate bias applied to the power stage transistors. For example, the RFIC PA architecture 110 based on positive envelope feedback can be implemented with little increase in overhead in terms of both circuit area and power requirements. Advantageously, in some embodiments, the RFIC PA architecture 110 can be implemented without the use of external off-chip circuit elements (such as signal processing elements, supply modulators, etc.). Another advantage of the RFIC PA architecture 110 is the simplicity of the architecture because it facilities its incorporation into existing PA configurations as well as its use in conjunction with other PA performance improvement architectures.

Figure 2B:
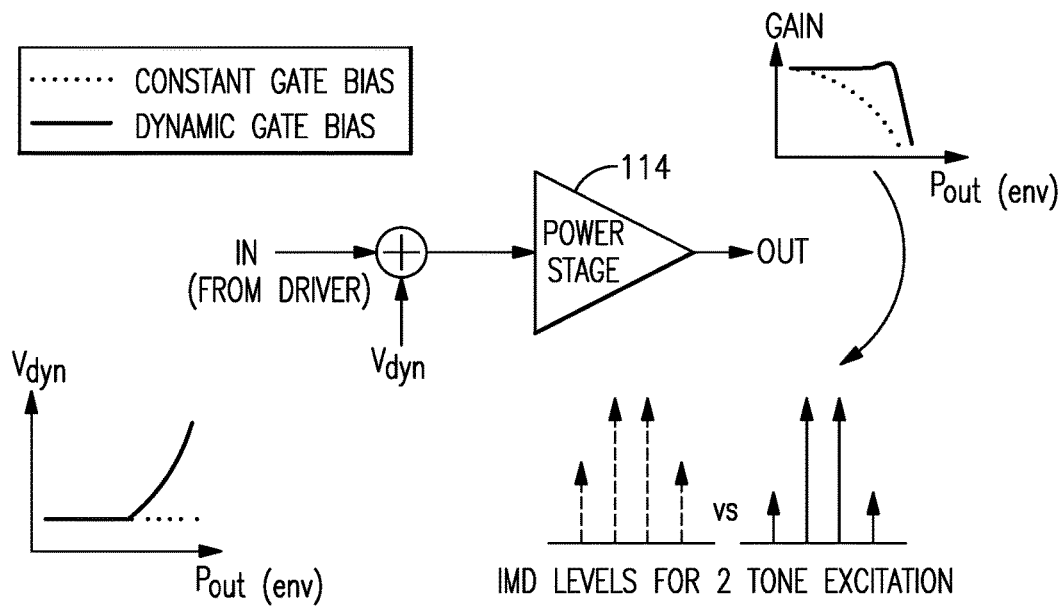
FIG. 2B illustrates improvement in performance of the PA architecture of FIG. 2A relative to a PA architecture with a constant gate bias.

FIG. 2B illustrates improvement in performance of the PA architecture 110 of FIG. 2A relative to a PA architecture with a constant gate bias. As the output power of the envelope (Pout(env)) increases, a higher value of the dynamic gate bias (Vdyn) increases the transconductance, $g_m$, of the power stage transistors 114. This counteracts the gain compression of the PA and substantially improves linearity of its AM-AM response, improving linearity of the PA. With a two-tone excitation, a decrease of the output inter-modulation (IMD) products may be achieved. Moreover, using the disclosed dynamic biasing techniques, the same level of IMD may be met at higher output power levels. In contrast, under a constant biasing scheme, such performance improvement would require a higher DC gate bias and possibly larger MOS devices, which may translate into higher quiescent current consumption and lower power added efficiency (PAE) relative to the disclosed dynamic biasing techniques.

Figure 3:
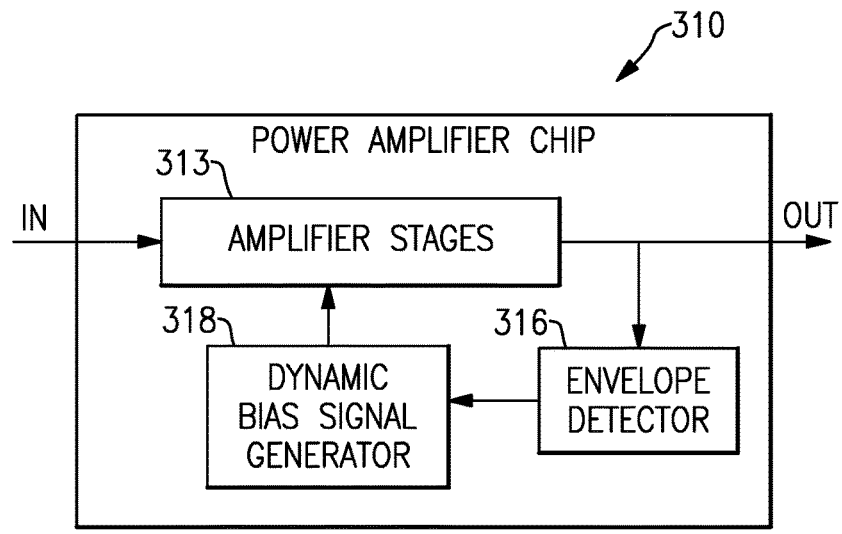
FIG. 3 illustrates another example PA architecture implemented on a single chip, such as a power amplifier chip.

FIG. 3 illustrates another example PA architecture 310 implemented on a single chip, such as a power amplifier chip. The PA architecture 310 receives an input signal and provides an amplified output signal using a plurality of amplifier stages 313. The PA architecture 310 includes an envelope detector 316 that receives a signal corresponding to the amplified output signal after the plurality of amplifier stages 313. The envelope detector 316 is configured to generate an envelope signal related to the amplified output signal, as described herein. The PA architecture 310 includes a dynamic bias signal generator 318 that receives the envelope signal from the envelope detector 316 and generates a dynamic bias signal related to the envelope of the amplified output signal of the plurality of amplifier stages 313. The dynamic bias signal generator 318 can also be configured to receive or to produce a constant DC signal that is combined with a signal related to the envelope signal to generate the dynamic bias signal. Each of the elements of the PA architecture 310 can be implemented on a single chip to provide a single-chip implementation of a standalone PA.

In some embodiments, the PA architecture 310 can be implemented using a single stage amplification process. In such embodiments, the dynamic bias signal can be used to bias a transistor of the amplifier.

Figure 4:
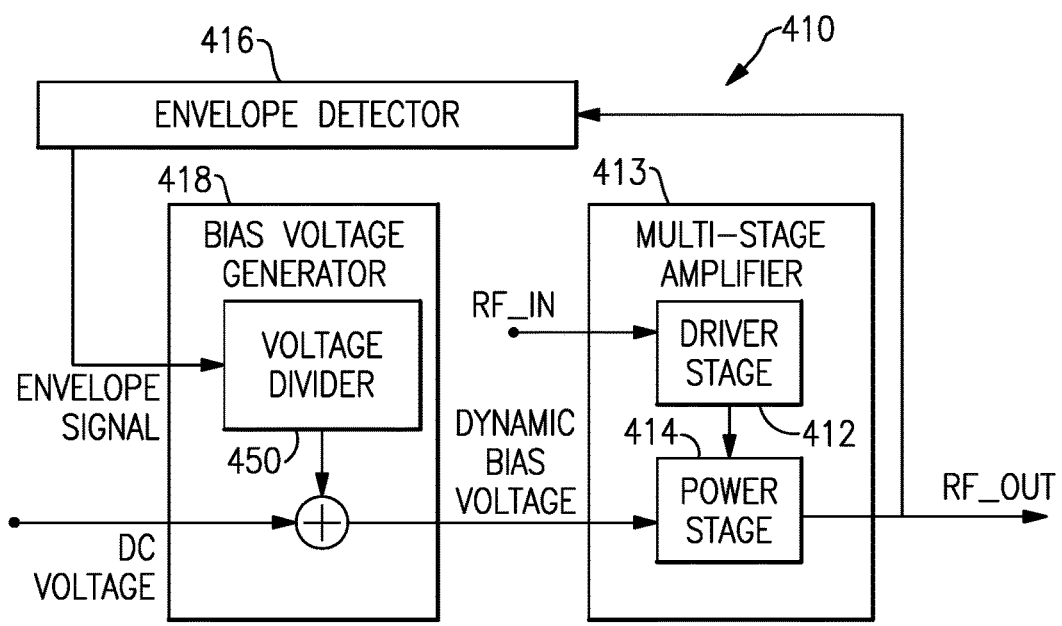
FIG. 4 illustrates another example PA architecture having a bias voltage generator and an envelope detector forming a positive feedback architecture for a multi-stage amplifier.

FIG. 4 illustrates another example PA architecture 410 having a bias voltage generator 418 and an envelope detector 416 forming a positive feedback architecture for a multi-stage amplifier 413. The envelope detector 416 is configured to receive a signal corresponding to an output of the multi-stage amplifier 413, to detect an envelope of that signal, and to generate an envelope signal corresponding to the detected envelope. The envelope detector 416 can include a detector that is configured to detect signals that span the expected range of amplitudes of the signals output by the multi-stage amplifier. Thus, the envelope detector 416 can be tailored for operation within an expected environment of the PA architecture 410. Advantageously, due at least in part to the envelope detector 416 receiving a signal corresponding to the output of the multi-stage amplifier, the envelope detector 416 can provide an envelope signal that more accurately and/or more precisely tracks the envelope of the output signal over a wider range of output signals relative to envelope tracking systems that detect output signals prior to being amplified and/or prior to the final amplification stage of a multi-stage amplifier.

The bias generator 418 receives the envelope signal from the envelope detector 416 and scales that signal using a voltage divider 450 to produce a scaled envelope signal. The voltage divider 450 can include a network of passive resistive or attenuating elements, such as resistors, that are configured to scale the envelope signal to a targeted scaled envelope signal range. The voltage divider 450 can be configured to scale the received signal based on an expected range of the envelope signal so that the scaled signal falls within the targeted scaled envelope signal range. The voltage divider 450 can include passive elements. The voltage divider 450 can have a wide bandwidth of operation. Consequently, the bias voltage generator 418 can function over a wide bandwidth.

The bias voltage generator 418 further receives a DC voltage, such as from a bias system as described herein with reference to FIG. 1. The bias voltage generator 418 combines the scaled envelope signal with the DC voltage to produce a dynamic bias voltage that is provided to the multi-stage amplifier. In some embodiments, the bias voltage generator 418 clamps the dynamic bias voltage at a low bias voltage threshold so that the dynamic bias voltage provided to the multi-stage amplifier 413 is not less than the low bias voltage threshold. Similarly, in certain embodiments, the bias voltage generator 418 clamps the dynamic bias voltage at a high bias voltage threshold so that the dynamic bias voltage provided to the multi-stage amplifier 413 is not greater than the high bias voltage threshold.

The multi-stage amplifier 413 includes a driver stage 412 and a power stage 414. Each of the driver stage 412 and the power stage 414 can include one or more transistors configured to amplify radio-frequency (RF) signals. The driver stage 412 is configured to receive an RF signal, to amplify the received RF signal with a first amplification, and to transmit the amplified RF signal to the power stage 414. The power stage 414 is configured to receive the amplified RF signal from the driver stage, to amplify the received signal with a second amplification, and to output the amplified output RF signal. In some embodiments, the second amplification is greater than the first amplification. The power stage 414 also receives the dynamic bias voltage provided by the bias voltage generator 418 to dynamically bias the transistor(s) in the power stage 414. As described in greater detail herein, this can improve performance of the PA architecture 413 through the use of the positive feedback architecture that includes the envelope detector 416 and the bias voltage generator 418.

Figure 5A:
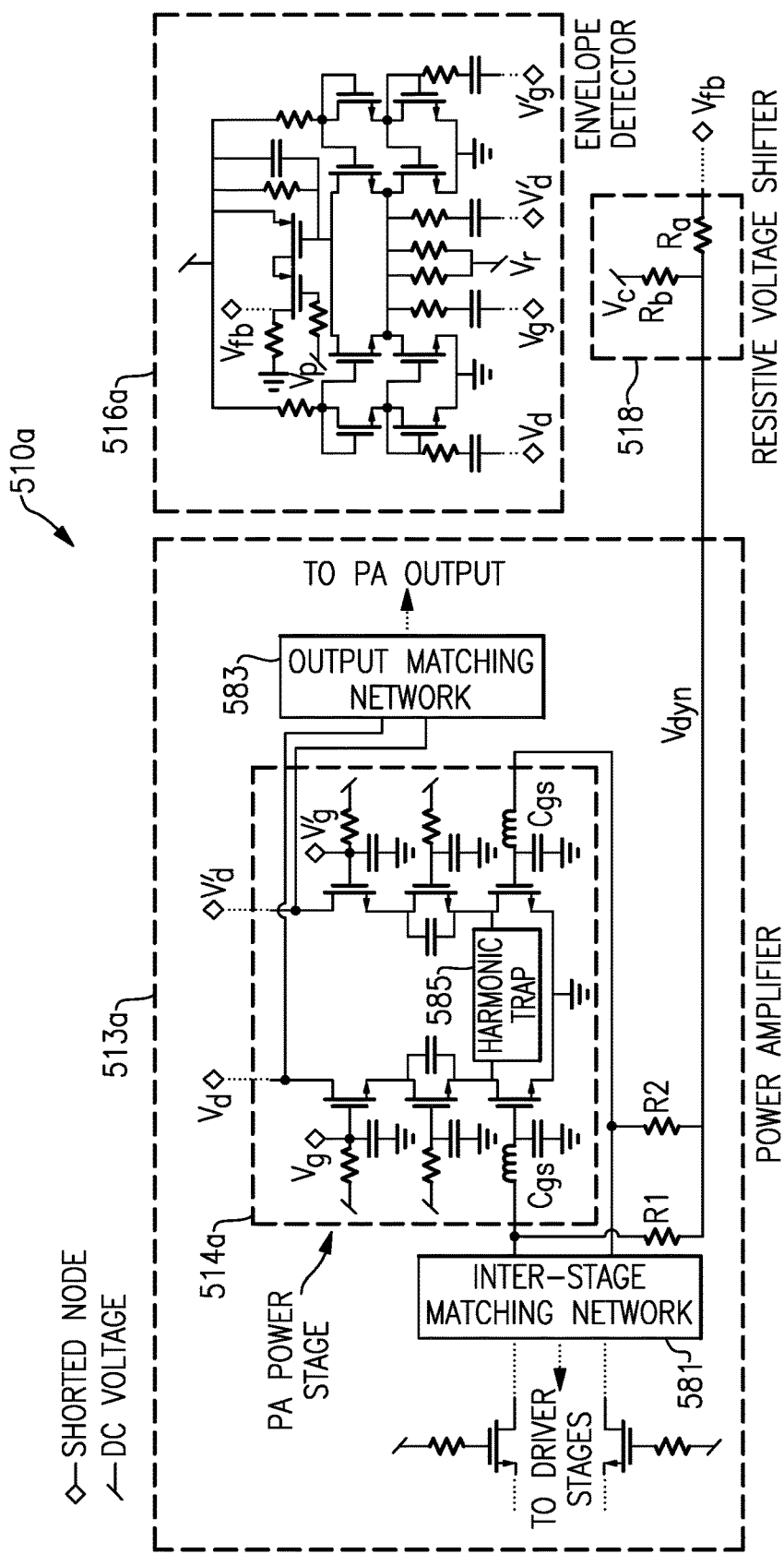
FIGS. 5A and 5B illustrate simplified schematics of example PA architectures with a power amplifier having driver stages and power stages, an envelope detector, and a resistive voltage shifter.
Figure 5B:
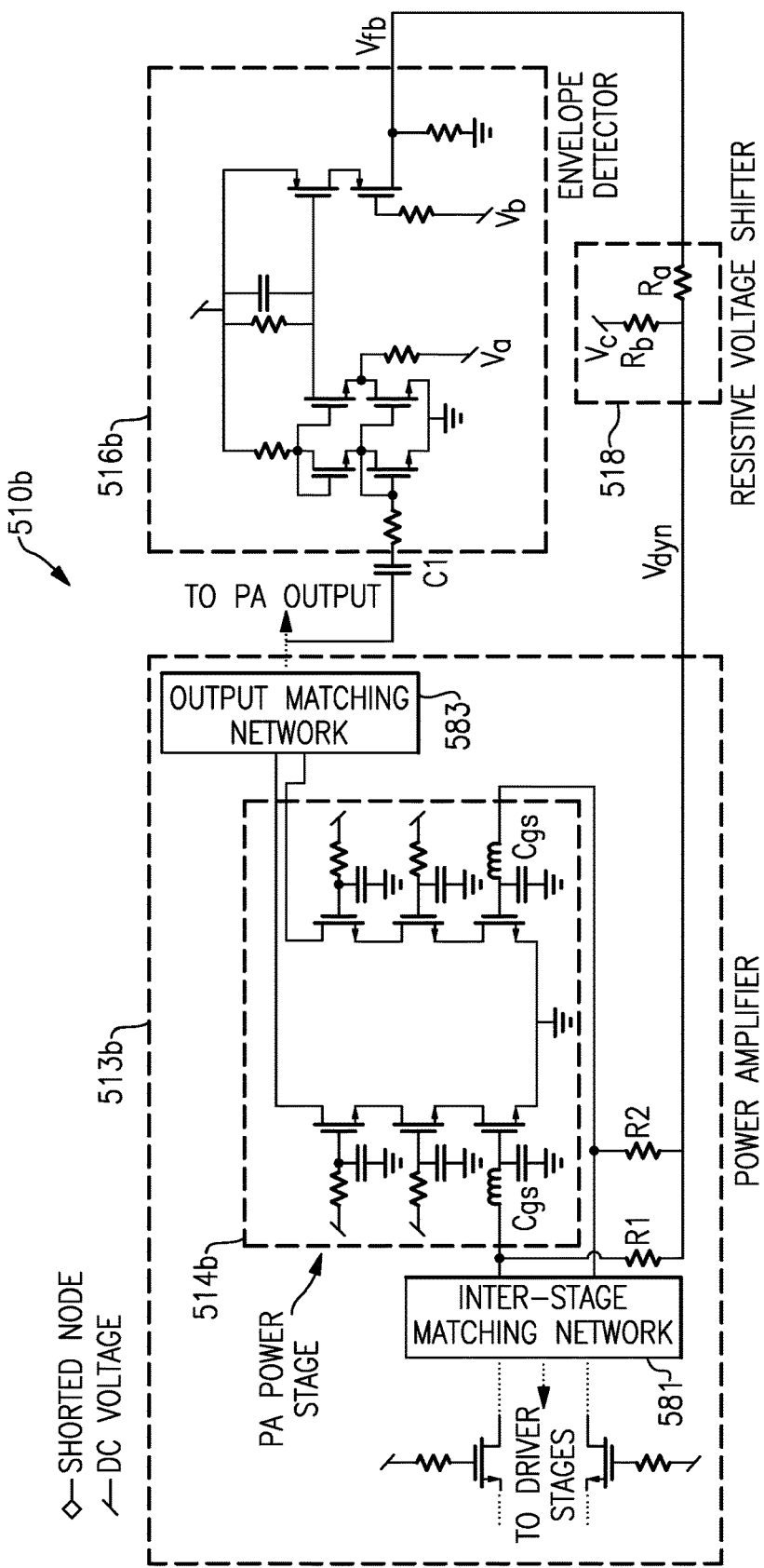

FIGS. 5A and 5B illustrate simplified schematics of example PA architectures 510a, 510b that include power amplifiers 513a, 513b having driver stages (not shown) and power stages 514a, 514b, envelope detectors 516a, 516b, and resistive voltage shifter 518. The power stages 514a, 514b can have a differential architecture. The PA architectures 510a, 510b can include matching networks such as an inter-stage matching network 581 between the driver stages and the power stages 514a, 514b and an output matching network 583 at an output of the power amplifiers 513a, 513b. In the PA architecture 510a, the power stage 514a includes a harmonic trap 585 to improve performance of the amplifier. In some embodiments, the values of the resistors R1 and R2 can each be about 5 kn.

In some embodiments, the PAs 513a, 513b can be tailored to amplify 5.4 GHz signals and can be fabricated using SOI-CMOS 0.18 µm technology. The PAs 513a, 513b can be a three-stage flip chip. For simulating performance of the PA architectures 510a, 510b, the PAs 513a, 513b can be interfaced to a PCB via a 6-layer multi-chip module (MCM). The envelope detectors 516a, 516b can be a wire-bond design. The size of the die of the PAs 513a, 513b can be about 2.800 mm×1.275 mm and the size of the die of the envelope detectors 516a, 516b can be about 11% of the size of the PA die. As described herein, where the PA architectures 510a, 510b are implemented on a single chip, wire-bonding pads may be eliminated resulting in a reduction of size of the envelope detectors 516a, 516b and the resistive voltage shifter 518 (e.g., about 5% of the size of the PA die). The resistive voltage shifter 518 can be implemented using SMT resistors to allow tuning.

With reference to FIG. 5A, the output of the power amplifier 513a is coupled to the envelope detector 516a at the indicated shorted nodes (e.g., Vd, V'd, Vg, and V'g). The envelope detector 516a generates an envelope or feedback signal, Vfb, that passes through the resistive voltage shifter 518 to scale and offset the envelope signal to generate the dynamic bias signal, Vdyn. The dynamic bias signal is provided to the power stage 514a to improve performance of the power amplifier 513a, as described herein. Various DC voltages are also provided to the PA architecture 510a as indicated in the figure. For example, the resistive voltage shifter 518 includes resistors Ra and Rb configured to scale the envelope signal, Vfb, and also includes a DC voltage, Vc, input at a DC node of the resistor Rb to offset the scaled feedback signal, thereby generating the dynamic bias signal, Vdyn.

With reference to FIG. 5B, the output of the power amplifier 513b is coupled to the envelope detector 516b through a capacitor, C1 (e.g., which may have a value of about 0.5 pF and can be a surface mount technology (SMT)

capacitor). The envelope detector 516b generates an envelope or feedback signal, Vfb, that passes through the resistive voltage shifter 518 to scale and offset the envelope signal to generate the dynamic bias signal, Vdyn. The dynamic bias signal, Vdyn, is provided to the power stage 514b to improve performance of the power amplifier 513b, as described herein. Various DC voltages (e.g., Va and Vb) are also provided to the envelope detector 516 and power amplifier 513b as indicated.

Simulated measurements can be performed using a circuit similar to the PA architecture 510 described herein with reference to FIGS. 5A and 5B. Results of these simulated measurements are presented in FIGS. 6-9. In the simulated circuit, the total quiescent current of the system is about 96 mA, of which the envelope detector consumes about 1.2%. The envelope detector remains biased for all the simulated measurements described herein.

Figure 6:
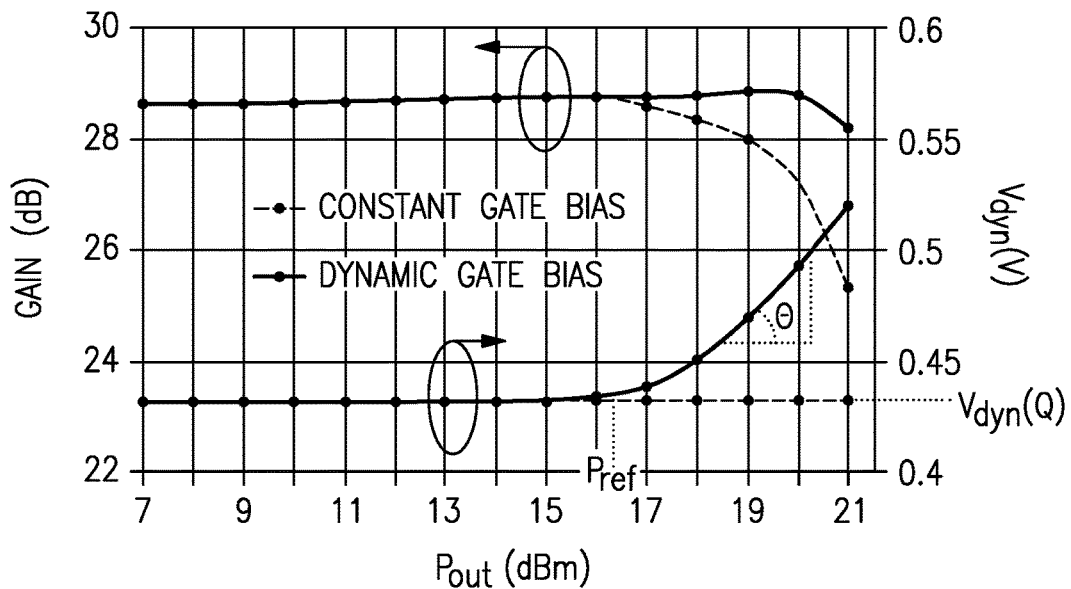
FIG. 6 illustrates the AM-AM conversion of the PA architecture of FIG. 5 under continuous wave (CW) excitation at 5.4 GHz in two states, a first state with a constant gate bias and a second state with a dynamic gate bias.

FIG. 6 illustrates the AM-AM conversion of the PA under continuous wave (CW) excitation at 5.4 GHz in two states, a first state with Ra open in the PA architecture 510 of FIG. 5 (labeled constant gate bias and illustrated with the dashed line) and a second state with Rb connected (labeled dynamic gate bias and illustrated with a solid line). The upper lines in the graph correspond to a plot of the gain as a function of output power of the PA while the lower lines in the graph correspond to a plot of the dynamic bias signal as a function of output power of the PA. These simulated measurements demonstrate that the 1 dB compression point (P1 dB) is increased by about 1.7 dB with the dynamic biasing.

FIG. 6 also illustrates that, for the detector bias conditions used in the simulation, a 60 mV increase of the gate bias signal, Vdyn, at low output powers is sufficient to improve the AM-AM conversion of the PA. Such an increase is not large enough to cause a drastic change in the PA transistor operating regime (e.g., a change from saturation to triode). The occurrence of a drastic change in the operating regime of the PA would typically translate into an excessive gain collapse and expansion in the measured gain vs. Pout response illustrated in FIG. 6.

The swing of the Vdyn signal illustrated in FIG. 6 is a function of the detector sensitivity (e.g., Pref), the gain conversion slope (e.g., the angle Θ), and the resistive voltage shifter (implemented using resistors Ra and Rb in the circuit described herein with reference to FIG. 5). The quiescent value, Vdyn(Q), of the signal, Vdyn, is fixed using the DC voltage input and the resistors Ra and Rb in the resistor voltage shifter of FIG. 5.

Figure 7:
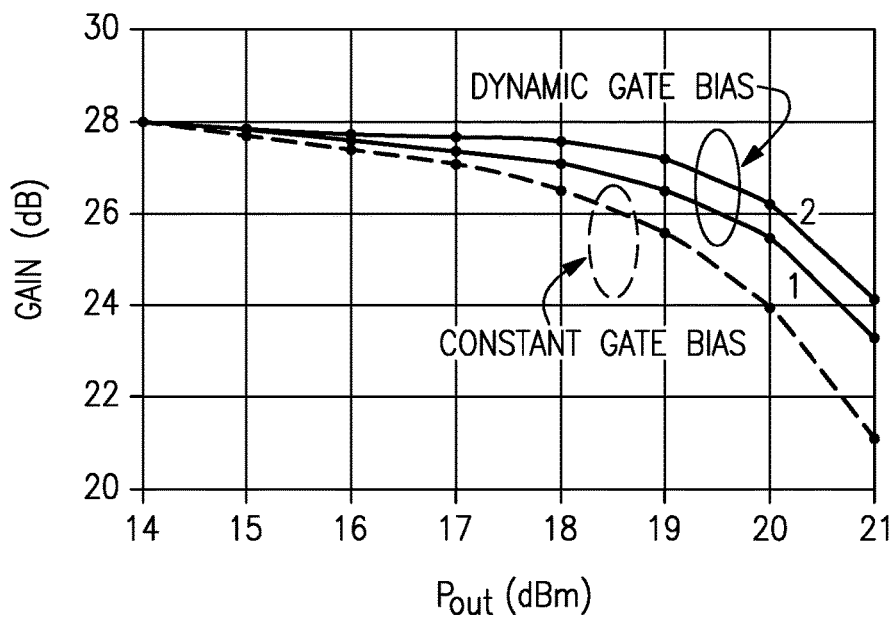
FIG. 7 illustrates the AM-AM conversion of the PA architecture of FIG. 5 under two-tone excitation at 5.4 GHz using 100 kHz frequency spacing in the same two states as FIG. 6, but with two different dynamic biasing profiles set by the adjustment of the detector sensitivity and gain conversion slope.
Figure 8:
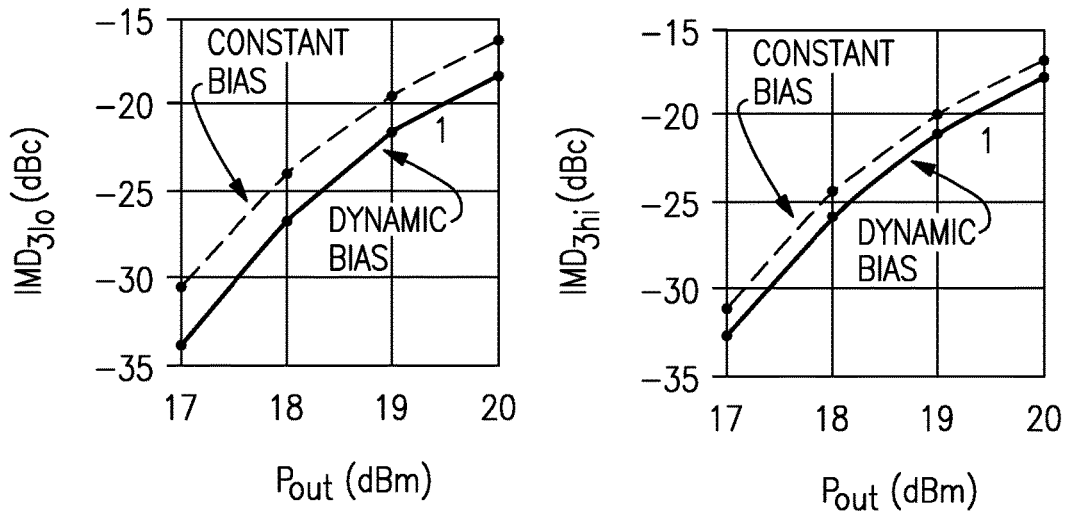
FIG. 8 illustrates an improvement in harmonic distortions obtained using the power amplifier architectures described herein.
Figure 9:
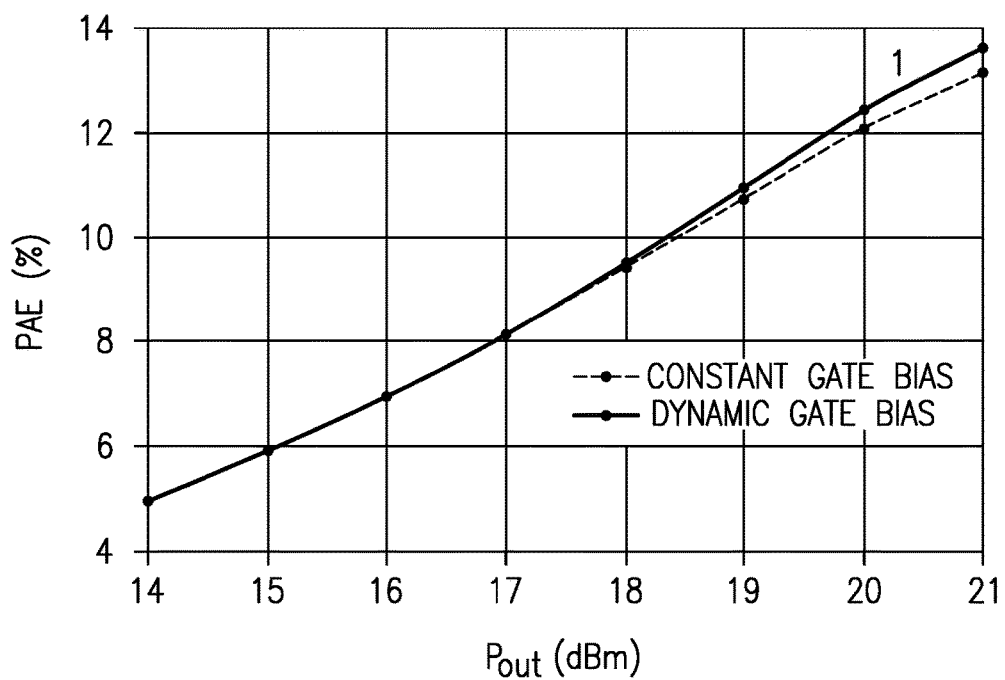
FIG. 9 illustrates simulated results demonstrating that there is an increase in power added efficiency (PAE) with the dynamic biasing described herein.

FIG. 7 illustrates the AM-AM conversion of the PA under two-tone excitation at 5.4 GHz using 100 kHz frequency spacing in the same two states (labeled constant gate bias and dynamic gate bias, respectively), but with two different dynamic biasing profiles set by the adjustment of the detector sensitivity and gain conversion slope (indicated with the numerals '1' and '2'). FIG. 8 illustrates that the 1.7 dB increase in the 1 dB compression point (P1 dB) translates into an improvement of up to about 3.44 dB and about 1.76 dB for IMD3lo and IMD3hi, respectively, for Pout levels from about 17 dBm to about 20 dBm. The corresponding simulated measurements in FIG. 9 illustrate that there is no degradation in PAE with the dynamic biasing, but rather a slight increase that results from a reduction in the drain current during the decreasing excursions of the envelope feedback signal. Although these IMD and PAE improvements may be moderate for this example architecture, they illustrate that the disclosed techniques can improve the overall linearity and PAE performance of a power amplifier architecture.

Improved performance may be achieved using a PMOS-based compensating capacitance on capacitors Cgs. Improvements may also be achieved by replacing the power stage resistors R1, R2 with inductors. For example, the 5 kΩ power stage resistors can be replaced with 15 nH inductors. This replacement can reduce or eliminate R-C time-constant overloading on the dynamic biasing function thereby improving AM-AM compensation over a larger bandwidth.

Figure 10A:
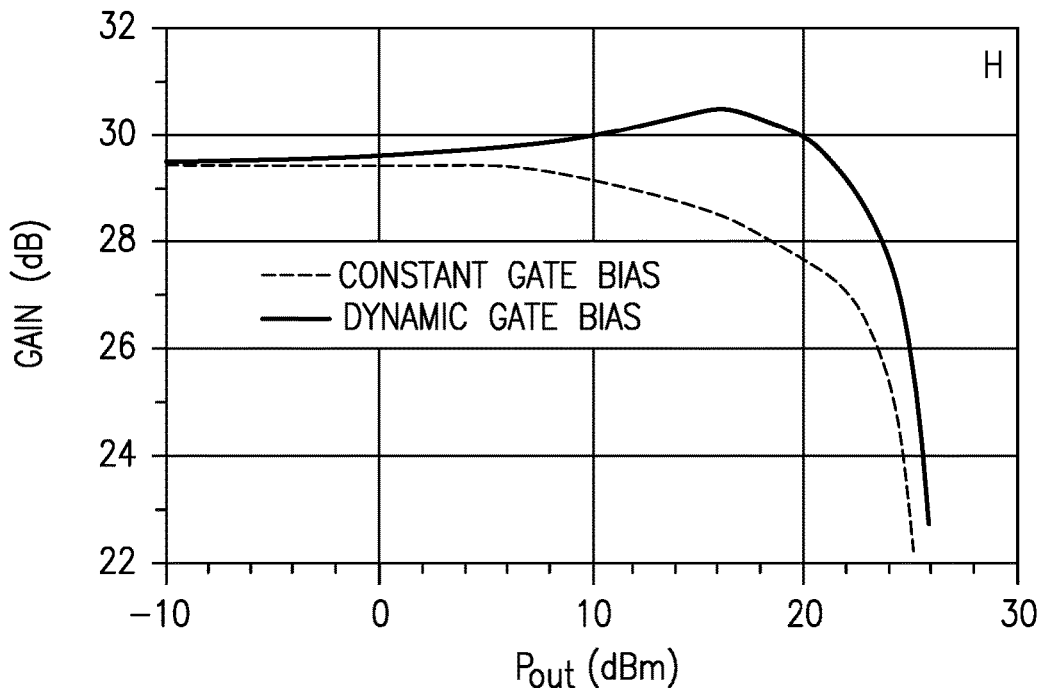
FIGS. 10A and 10B illustrate simulated results based on a two-tone excitation and using a Cgs compensation technique that results in AM-AM compensation.
Figure 10B:
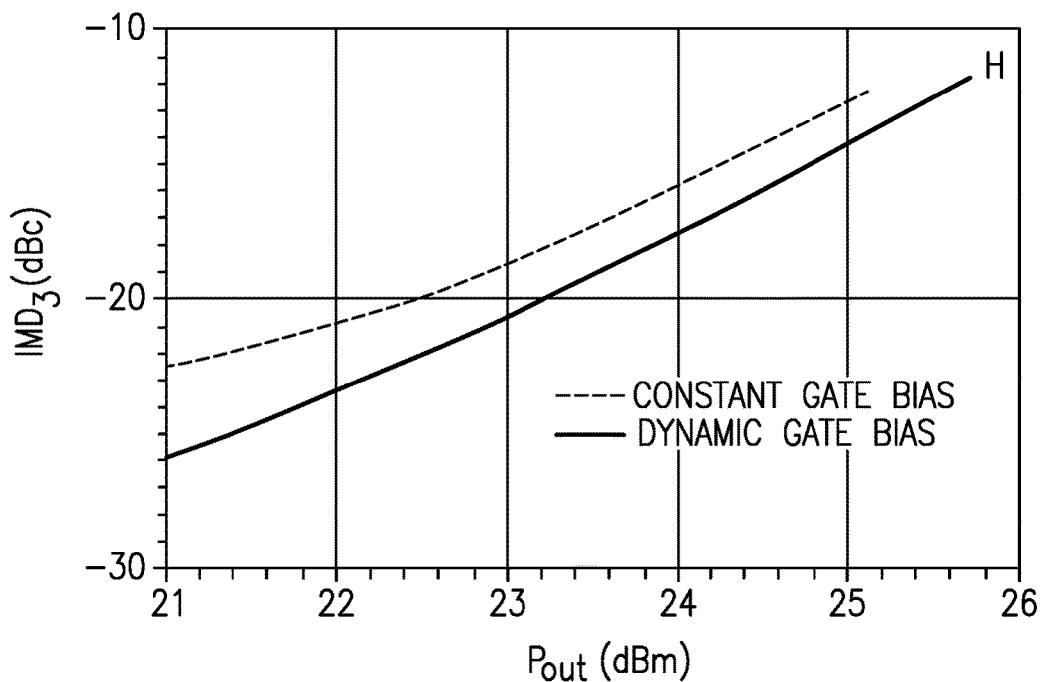

Using this Cgs compensation technique, simulations with a two-tone excitation at 5.4 GHz and 10 MHz frequency spacing are shown in FIGS. 10A and 10B. Comparing the curves in the two states (constant gate bias and dynamic gate bias), the simulation illustrates a significant AM-AM compensation. For output power levels higher than about 21 dBm (e.g., where the gain compression of the PA is predominant over the Cgs effects), this AM-AM compensation translates into an IMD3 improvement of up to about 3.5 dB.

Simulations also illustrate that the proposed architecture does not significantly degrade PA noise levels with respect to specifications for 5 GHz WLAN TDD systems as well as cellular FDD systems. Simulation results for the latter are shown in Table 1, which show noise power levels in the Rx channel at ±20 MHz to ±50 MHz frequency offset. Under dynamic biasing, the slight degradation in noise levels at high output power may be a consequence of the increased bias level, Vdyn, and consequent increase of RF gain.

TABLE 1

| BIASING TECHNIQUE | simulated noise power for Pout = 23 dBm | | | | | |
|---|---|---|---|---|---|---|
| | Noise Power (dBm) at ±Offset (Hz) from Carrier | | | | | |
| | −50M | −30M | −20M | +20M | +30M | +50M |
| Constant Bias | −147.2 | −146.4 | −145.2 | −144.7 | −146.0 | −146.8 |
| Dynamic Bias | −146.2 | −145.3 | −143.8 | −143.2 | −144.8 | −145.8 |

Example Amplification Method Using Dynamic Gate Biasing

Figure 11:
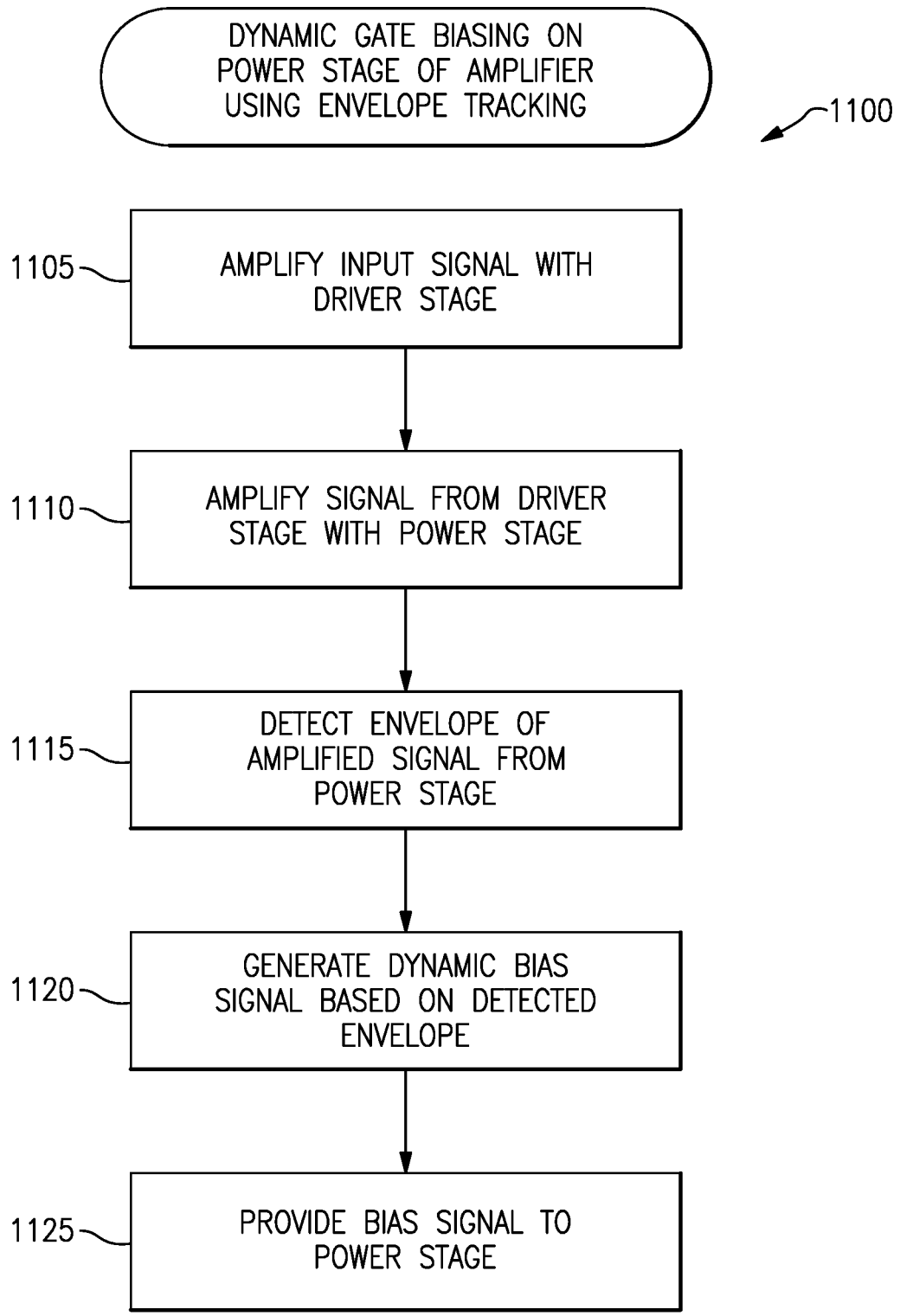
FIG. 11 illustrates a flow chart of an example method of amplifying a signal using dynamic gate biasing.

FIG. 11 illustrates a flow chart of an example method 1100 of amplifying a signal using dynamic gate biasing. The method 1100 can be performed by a PA architecture. In some embodiments, the PA architecture is a standalone PA implemented on a single chip.

At block 1105, the PA architecture amplifies an input signal using a driver stage of a multi-stage amplifier. The input signal can be a radio-frequency (RF) signal. The driver stage can include one or more transistors configured to provide a first amplification to the input signal.

At block 1110, the PA architecture further amplifies the input signal using a power stage of the multi-stage amplifier. The power stage can include one or more transistors configured to provide a second amplification to the signal amplified by the driver stage. In some embodiments, the second amplification is larger than the first amplification.

At block 1115, the PA architecture detects an envelope of the amplified signal output by the power stage. At block 1120, the PA architecture generates a dynamic bias signal based on the detected envelope. In some embodiments, the dynamic bias signal is proportional to the envelope detected by the PA architecture. In certain embodiments, the dynamic bias signal is offset using a DC signal. At block 1125, the PA architecture biases a transistor of the power stage using the dynamic bias signal.

Design Considerations

Performance of the PA architectures described herein that utilize dynamic bias signals can be improved or tailored based on particular design considerations. For example, based on the Nyquist criterion, the positive feedback architecture of the PAs described herein can be configured so that the maximum gain of the feedback loop is less than or equal to about 0 dB. This design consideration increases the stability of the disclosed PA architectures with positive envelope feedback. In some embodiments, the loop gain is a few dB (e.g., at least 1 dB, at least 2 dB, at least 3 dB, at least 4 dB, at least 5 dB, at least 7 dB, at least 9 dB, etc.) below the maximum possible loop gain of about 0 dB. As used herein, the loop gain includes the up-conversion gain (e.g., from the power stage transistor gate to the PA output) and the gain through the feedback elements (e.g., the envelope detector and the resistive voltage shifter elements). Due at least in part to the relatively large value of the up-conversion gain, the RF-analog conversion gain of the envelope detector can be well below 0 dB. In various implementations, the typical voltage swing for the dynamic bias signal is less than or equal to about 0.1 V and the maximum voltage swing for a typical implementation may be on the order of about 0.1 V (e.g., less than or equal to about 0.4 V, less than or equal to about 0.2 V, less than or equal to about 0.08 V, less than or equal to about 0.05 V, less than or equal to about 0.04 V, less than or equal to about 0.02 V, etc.). This implies that the feedback elements (e.g., the envelope detector and the resistive voltage shifter) can be implemented using attenuation elements. This may facilitate achieving a targeted loop gain of less than 0 dB.

The targeted loop gain design consideration may be also beneficial with respect to noise performance. Due at least in part to the up-conversion gain through the PA power stage typically being high, the attenuation by the elements in the feedback loop (e.g., the envelope detector and the voltage shifter circuit) may be high so that an overall loop gain does not exceed about 0 dB. In such cases, the noise levels at the output of the PA are attenuated by the elements in the feedback loop before being injected back into the PA as part of the dynamic bias signal. Accordingly, in some embodiments, up-converted noise levels at the output of the PA are therefore not significantly increased or aggravated by the positive envelope feedback architectures and methods described herein.

Another design consideration is the loop bandwidth. A targeted loop bandwidth can be one to a few orders of magnitude higher (e.g., at least 10 times higher, at least 20 times higher, at least 50 times higher, at least 100 times higher, at least 1000 times higher, at least 10,000 times higher, etc.) than the expected or targeted maximum envelope frequency of the signal to be transmitted by the PA. Lower targeted loop bandwidths may also be suitable. For example, a loop bandwidth that is about four to five times the expected or targeted maximum envelope frequency may be suitable. Meeting the targeted loop bandwidth can reduce or minimize the phase delay between the output signal of the PA and the injected dynamic bias signal. An advantage of the PA architectures described herein is that the architectures are not constrained by the bandwidth limitations associated with typical PA biasing circuits. Another advantage is that a resistive voltage shifter circuit has a wideband frequency response. By implementing the disclosed PA architectures with a relatively large loop bandwidth, such PA architectures can be used for RFIC PA designs that transmit signals with fast varying envelopes.

Example Modules and Devices

Figure 12:
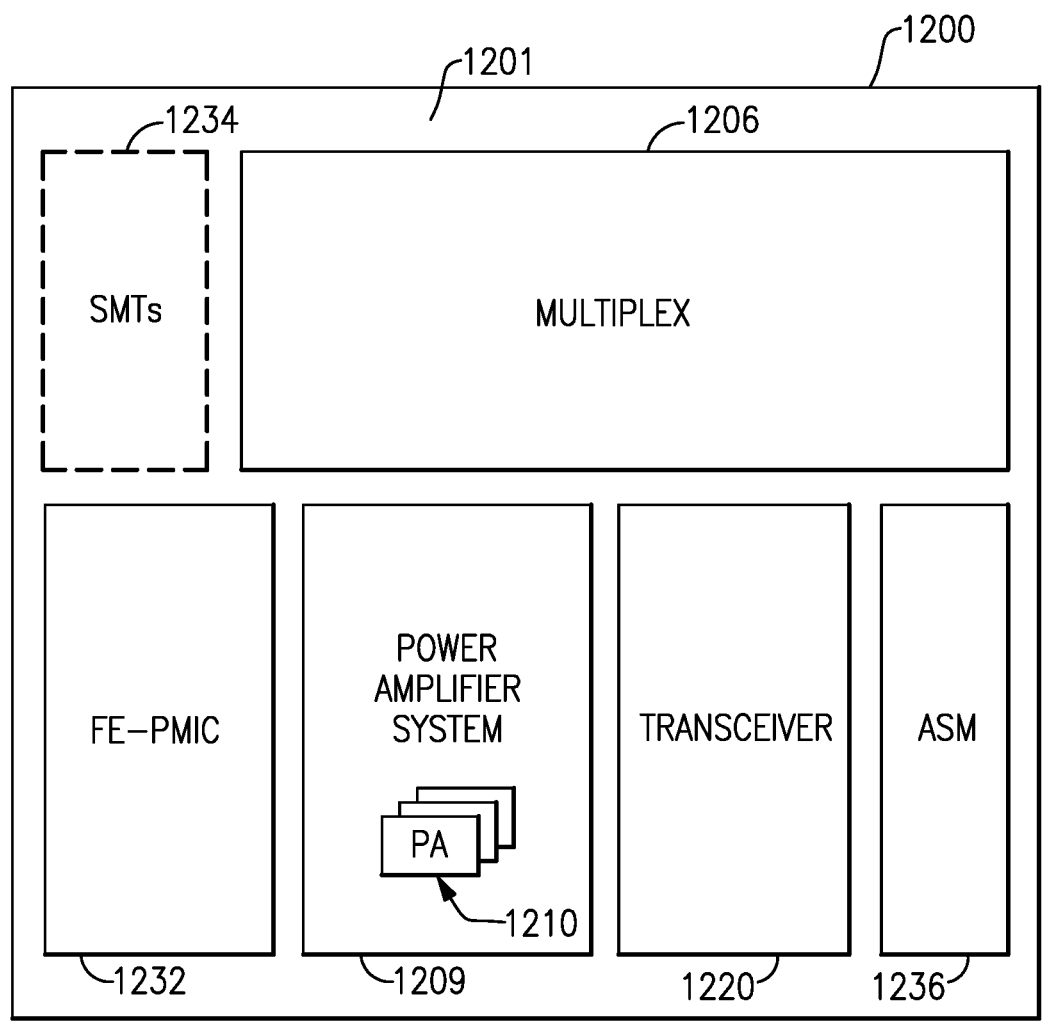
FIG. 12 illustrates that some or all the wireless communications configurations disclosed herein can be implemented, wholly or partially, in a module.

FIG. 12 illustrates that in some embodiments, some or all the wireless communications configurations disclosed herein (e.g., those described with reference to FIGS. 1-5) can be implemented, wholly or partially, in a module. Such a module can be, for example, a front-end module (FEM). In the example of FIG. 12, a module 1200 can include a packaging substrate 1201, and a number of components can be mounted on such a packaging substrate 1201. For example, an FE-PMIC component 1232, a power amplifier system 1209 which includes one or more PAs 1210 (examples of which are described herein with reference to FIGS. 2 5), a transceiver 1220, and a multiplexer assembly 1206 can be mounted and/or implemented on and/or within the packaging substrate 1201. Other components such as a number of SMT devices 1234 and an antenna switch module (ASM) 1236 can also be mounted on the packaging substrate 1201. Although all of the various components are depicted as being laid out on the packaging substrate 1201, it will be understood that some component(s) can be implemented over other component(s).

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 13:
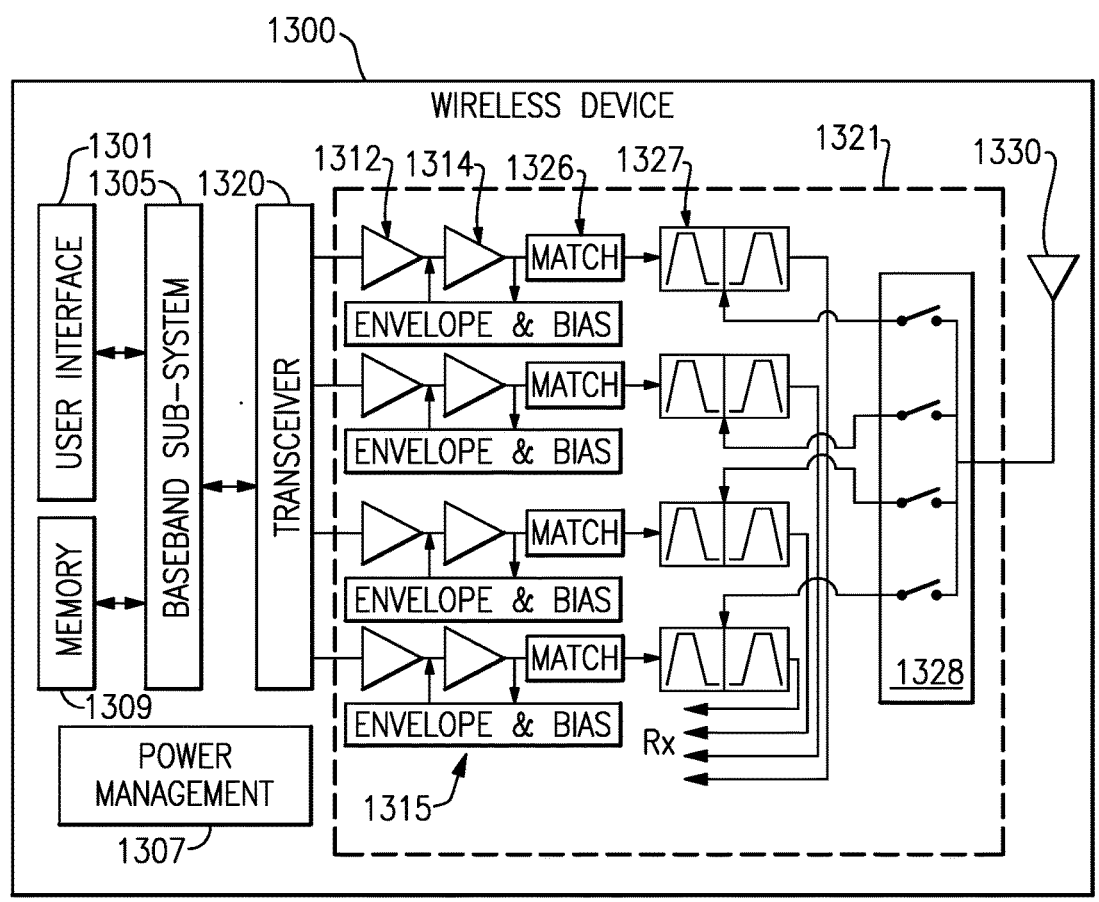
FIG. 13 illustrates an example wireless device having one or more advantageous features described herein.

FIG. 13 illustrates an example wireless device 1300 having one or more advantageous features described herein. In the context of a module having one or more features as described herein, such a module can be generally depicted by a dashed box 1321, and can be implemented as, for example, a front-end module (FEM) coupled to an antenna 1330 and a transceiver 1320.

The wireless device 1300 can include power amplifiers (PAs) each including a driver stage 1312 and a power stage 1314 that receive their respective RF signals from the transceiver 1320, the transceiver 1320 being configured and operated in known manners to generate RF signals to be amplified and transmitted, and to process received signals. The transceiver 1320 is shown to interact with a baseband sub-system 1305 that is configured to provide conversion between data and/or voice signals suitable for a user and RF signals suitable for the transceiver 1320. The transceiver 1320 can also be in communication with a power management component 1307 that is configured to manage power for the operation of the wireless device 1300. Such power management can also control operations of the baseband sub-system 1305 and the module 1321.

The baseband sub-system 1305 is shown to be connected to a user interface 1301 to facilitate various input and output of voice and/or data provided to and received from the user. The baseband sub-system 1305 can also be connected to a memory 1309 that is configured to store data and/or instructions to facilitate the operation of the wireless device, and/or to provide storage of information for the user.

In the example wireless device 1300, outputs of the PAs are shown to be matched (via respective output match circuits 1326) and routed to their respective diplexers 1327. Such amplified and filtered signals can be routed to an antenna 1330 (or multiple antennas) through an antenna switch 1328 for transmission. In some embodiments, the diplexers 1327 can allow transmit and receive operations to be performed simultaneously using a common antenna (e.g., antenna 1330). Received signals are shown to be routed to "Rx" paths (not shown) that can include, for example, a low-noise amplifier (LNA). In some implementations, the receive paths also include one or more filters (not shown).

The wireless device 1300 includes a plurality of PAs each including a driver stage 1312, a power stage 1314, and an envelope detector and bias generator 1315. The envelope detector and bias generator 1315 is configured to determine an envelope signal based on the output of the PAs and to generate a bias voltage for the power stage 1314. The envelope detector and bias generator 1315 can be configured as described herein with respect to FIGS. 2-5. For example, the envelope detector and bias generator 1315 can include one or more components configured to determine an envelope of the signal output by the power stage 1314. Based on this determined envelope, a dynamic bias signal can be generated and applied to the gate or base of a transistor of the power stage 1314. Such a configuration can be implemented on a single chip to provide a single-chip standalone PA solution. The configuration can also improve the power added efficiency (PAE) of the PA with little or no negative effect on PA linearity. This improvement comes with little additional complexity, little additional current consumption, and/or little additional chip area.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier architecture comprising:
a multi-stage amplifier having an input port and an output port, the multi-stage amplifier to receive an input signal at the input port and to provide an amplified output signal at the output port;
an envelope detector coupled to the output port of the multi-stage amplifier, the envelope detector configured to receive a signal corresponding to the amplified output signal and to generate an envelope signal related to an envelope of the amplified output signal; and
a dynamic bias signal generator coupled to the envelope detector and to the multi-stage amplifier, the dynamic bias signal generator configured to receive the envelope signal from the envelope detector and to scale the envelope signal using a voltage divider, to receive a DC signal, to generate a dynamic bias signal related to the envelope of the amplified output signal with the DC signal being used to offset the scaled envelope signal to generate the dynamic bias signal, and to provide the dynamic bias signal to the multi-stage amplifier.

2. The power amplifier architecture of claim 1 wherein the power amplifier architecture is implemented on a single chip.

3. The power amplifier architecture of claim 1 wherein the DC signal corresponds to a quiescent biasing condition of the multi-stage amplifier.

4. The power amplifier architecture of claim 1 wherein the multi-stage amplifier includes a driver stage coupled to the input port and a power stage coupled to the output port.

5. The power amplifier architecture of claim 4 wherein the dynamic bias signal is used to bias a transistor of the power stage.

6. The power amplifier architecture of claim 1 wherein the envelope detector is configured to detect signals that span an expected range of amplitudes of the amplified output signal.

7. The power amplifier architecture of claim 1 wherein a loop gain is less than or equal to 0 dB, the loop gain including a gain of an up-conversion gain through the multi-stage amplifier and a gain of a signal path through the envelope detector and the dynamic bias signal generator.

8. The power amplifier architecture of claim 7 wherein the loop gain is less than or equal to −3 dB.

9. The power amplifier architecture of claim 1 wherein a loop bandwidth is at least four times higher than a bandwidth of the envelope of the amplified output signal.

10. The power amplifier architecture of claim 1 wherein the envelope signal generated by the envelope detector corresponds to an instantaneous output power of the multi-stage amplifier.

11. The power amplifier architecture of claim 1 wherein the power amplifier architecture is implemented using CMOS or GaAs technologies.

12. The power amplifier architecture of claim 1 wherein the power amplifier architecture is implemented on a single chip and does not use signal processing provided by a component that is not on the single chip to determine the envelope signal or to determine the dynamic bias signal.

13. A radio-frequency (RF) module comprising:
a packaging substrate configured to receive a plurality of components; and
a power amplification system implemented on the packaging substrate, the power amplification system including a multi-stage amplifier configured to provide an amplified output signal having an envelope, an envelope detector configured to detect the envelope of the amplified output signal, and a resistive voltage shifter configured to generate a dynamic bias signal related to the detected envelope of the amplified output signal and to provide the dynamic bias signal to the multi-stage amplifier.

14. The RF module of claim 13 wherein the RF module is a front-end module (FEM).

15. The RF module of claim 13 wherein the multi-stage amplifier, the envelope detector, and the resistive voltage shifter are implemented on a single chip.

16. A wireless device comprising:
a transceiver configured to generate an input radio-frequency (RF) signal;
a front-end module (FEM) in communication with the transceiver, the FEM including a packaging substrate configured to receive a plurality of components, the FEM further including a power amplification system implemented on the packaging substrate, the power amplification system configured to amplify the input RF signal to generate an amplified output RF signal, the power amplification system including a multi-stage amplifier configured to provide the amplified output signal having an envelope, an envelope detector configured to detect the envelope of the amplified output signal, and a resistive voltage shifter configured to generate a dynamic bias signal related to the detected envelope of the amplified output signal and to provide the dynamic bias signal to the multi-stage amplifier; and an antenna in communication with the FEM, the antenna configured to transmit the output RF signal.

17. The wireless device of claim 16 wherein the resistive voltage shifter includes a voltage divider to scale the detected envelope.

18. The wireless device of claim 17 wherein the dynamic bias signal biases a gate of a transistor of the multi-stage amplifier.

19. A power amplifier architecture comprising:
a multi-stage amplifier having an input port and an output port, the multi-stage amplifier to receive an input signal at the input port and to provide an amplified output signal at the output port;
an envelope detector coupled to the output port of the multi-stage amplifier, the envelope detector configured to receive a signal corresponding to the amplified output signal and to generate an envelope signal related to an envelope of the amplified output signal; and
a dynamic bias signal generator coupled to the envelope detector and to the multi-stage amplifier, the dynamic bias signal generator configured to receive the envelope signal from the envelope detector, to generate a dynamic bias signal related to the envelope of the amplified output signal, and to provide the dynamic bias signal to the multi-stage amplifier, with a loop gain of the architecture being less than or equal to 0 dB, the loop gain including a gain of an up-conversion gain through the multi-stage amplifier and a gain of a signal path through the envelope detector and the dynamic bias signal generator.

20. The power amplifier architecture of claim 19 wherein the loop gain is less than or equal to −3 dB.

* * * * *